United States Patent [19]

Delaney et al.

[11] Patent Number: 5,595,917

[45] Date of Patent: Jan. 21, 1997

[54] METHOD FOR HYDROGEN TREATMENT OF FIELD EFFECT TRANSISTORS FOR USE IN HERMETICALLY SEALED PACKAGES

[75] Inventors: Michael J. Delaney; Loi D. Nguyen, both of Thousand Oaks; Minh V. Le, Simi Valley; Jorge L. Tizol, Los Angeles; James C. Loh, Torrance, all of Calif.

[73] Assignee: Hughes Aircraft Company, Los Angeles, Calif.

[21] Appl. No.: 381,042

[22] Filed: Jan. 31, 1995

[51] Int. Cl.$^6$ ............................................. H01L 21/66
[52] U.S. Cl. .......................... 437/8; 437/40; 437/248; 148/DIG. 162
[58] Field of Search .................... 437/8, 40 R, 248; 148/DIG. 162

[56] References Cited

U.S. PATENT DOCUMENTS

| | | | |
|---|---|---|---|
| 4,354,308 | 10/1982 | Shimada et al. | 437/160 |
| 5,322,808 | 6/1994 | Brown et al. | 437/248 |
| 5,381,103 | 1/1995 | Edmond et al. | 437/8 |
| 5,395,785 | 3/1995 | Nguyen et al. | 437/919 |

*Primary Examiner*—Kevin M. Picardat
*Attorney, Agent, or Firm*—V. D. Duraiswamy; W. K. Denson-Low

[57] ABSTRACT

A method for hydrogen treatment of FETs for use in hermetically sealed packages is disclosed. FETs such as GaInAs HEMTs are treated before hermetic packaging by heating them in a hydrogen atmosphere until their drain currents degrade, and then continuing to heat them until their drain currents are restored. The HEMTs' drain currents are monitored and the process is continued until the currents stabilize. Thereafter the devices' temperature is lowered to the desired operating temperature and their drain currents are measured. If the drain currents after treatment are close enough to the current levels before treatment, the devices are selected; otherwise they are rejected.

19 Claims, 4 Drawing Sheets

METHOD FOR HYDROGEN TREATMENT OF FIELD EFFECT TRANSISTORS FOR USE IN HERMETICALLY SEALED PACKAGES

GOVERNMENT RIGHTS

This invention was made with Government support under N00039-88-C-0300 awarded by the Department of the Navy. The Government has certain rights in this invention.

BACKGROUND OF THE INVENTION

1. Field of the Invention

The present invention generally relates to the degradation that occurs when compound semiconductor Field Effect Transistors (FETs) having gates that include Pt or Pd barrier layers are exposed to hydrogen, and more specifically to a method for pretreating the FETs to substantially prevent such degradation.

2. Description of the Related Art

Integrated circuits (ICs) are often hermetically packaged to improve their reliability, extend their lifetimes and improve their performance. The hermetic package prevents moisture from coming in contact with the devices and degrading their performance. Hermetic packaging is required in many space subsystems and military applications.

The ICs produce heat when operated, which over a period of time causes hydrogen that is trapped in the hermetic packaging to be released within the package. Most devices are unaffected by the hydrogen release. However FETs that are formed on a compound semiconductor substrate such as InP or GaAs, and have gates that include Pt or Pd barrier layers (typically TiPtAu or TiPaAu gates), degrade when exposed to a hydrogen atmosphere. The FET's degradation is sudden and dramatic, causing the device to fail far short of its expected lifetime. Hermetically packaged hydrogen-sensitive FETs have an expected lifetime of only approximately 3 years as a result of the hydrogen effect. By contrast, unpackaged FETs of the same type have lifetimes of approximately 15 years.

FETs affected by hydrogen exposure are used extensively in radio frequency (RF) subsystems for low noise amplifiers, power amplifiers and microwave monolithic integrated circuits (MMICs). One example of such an FET is a GaInAs high electron mobility transistor (HEMT), which is described in Mishra et al., "Microwave Performance of AlInAs-GaInAs HEMT's with 0.2- and 0.1-μm Gate Length", *IEEE Electron Device Letters*, Vol. 9, No. 12, Dec. 1988, pp. 647–649.

One explanation for the cause of the degradation is offered in Camp et al., "Hydrogen Effects on Reliability of GaAs MMICs" *Semiconductor Device Reliability*, 1990, pp. 471–477. The authors believe that the Pt or Pd barrier metal acts as a catalyst to ionize the molecular hydrogen, which then recombines with the ionized silicon donors in the channel. In this manner the charge carriers are depleted from the channel, causing the device's drain current to drop. Camp et al show that the degradation effects are not permanent and that a significant portion of the current loss can be temporarily restored by heating the device in a 100% nitrogen atmosphere. However, the current restoration is not permanent and further degradation occurs after the device has been hermetically sealed.

In applications such as satellite communications and military products, device performance and lifetime is very important and replacement is often impractical. In these systems the FETs are typically fabricated with TiAl or WAu gate metalizations, which are not affected by the exposure to hydrogen. However, these FETs exhibit a relatively high electron migration that limits their lifetime to approximately 10 years, thus limiting the lifetime of the satellite or other products into which they are incorporated and increasing its effective cost. Additionally, these devices are not efficient at higher power levels, and hence will limit the performance of higher powered satellites. In mass produced commercial applications, failure is not critical and replacement is possible, although it can be time consuming and expensive.

GaInAs HEMTs and in general the hydrogen-sensitive compound semiconductor FETs are relatively easy to fabricate, have long lifetimes (typically 15 years) due to relatively low electron migration and can handle relatively high power levels. Exposing the FETs to hydrogen causes degradation that prevents their use in many applications and increases their cost in others. While it is possible to avoid the problem by removing the hydrogen from the hermetic package, current techniques for doing this are very difficult, time consuming and expensive. Therefore it would be highly desirable to find a simple and cost efficient method for making hydrogen-sensitive FETs impervious to hydrogen exposure without degrading their electrical properties.

SUMMARY OF THE INVENTION

The present invention seeks to provide a method for pretreating FETs before they are hermetically packaged so that their performance is not affected by exposure to the hydrogen atmosphere inside the package.

This is accomplished by heating the FET in the presence of hydrogen until its performance degrades, and then continuing to heat the FET in the presence of hydrogen until its performance is permanently restored. The FET's performance is preferably monitored by measuring its drain current, which exhibits a sudden and dramatic change during the treatment but is gradually restored. The FET is heated until the current stabilizes. Thereafter the device's temperature is lowered to the desired operating temperature and its drain current is measured. If the drain current is close enough to the FET's current before the treatment, then the device is selected; if not it is rejected and may be reheated.

For a better understanding of the invention, and to show how the same may be carried into effect, reference will now be made, by way of example, to the accompanying drawings.

DETAILED DESCRIPTION OF THE INVENTION

Figure 1:
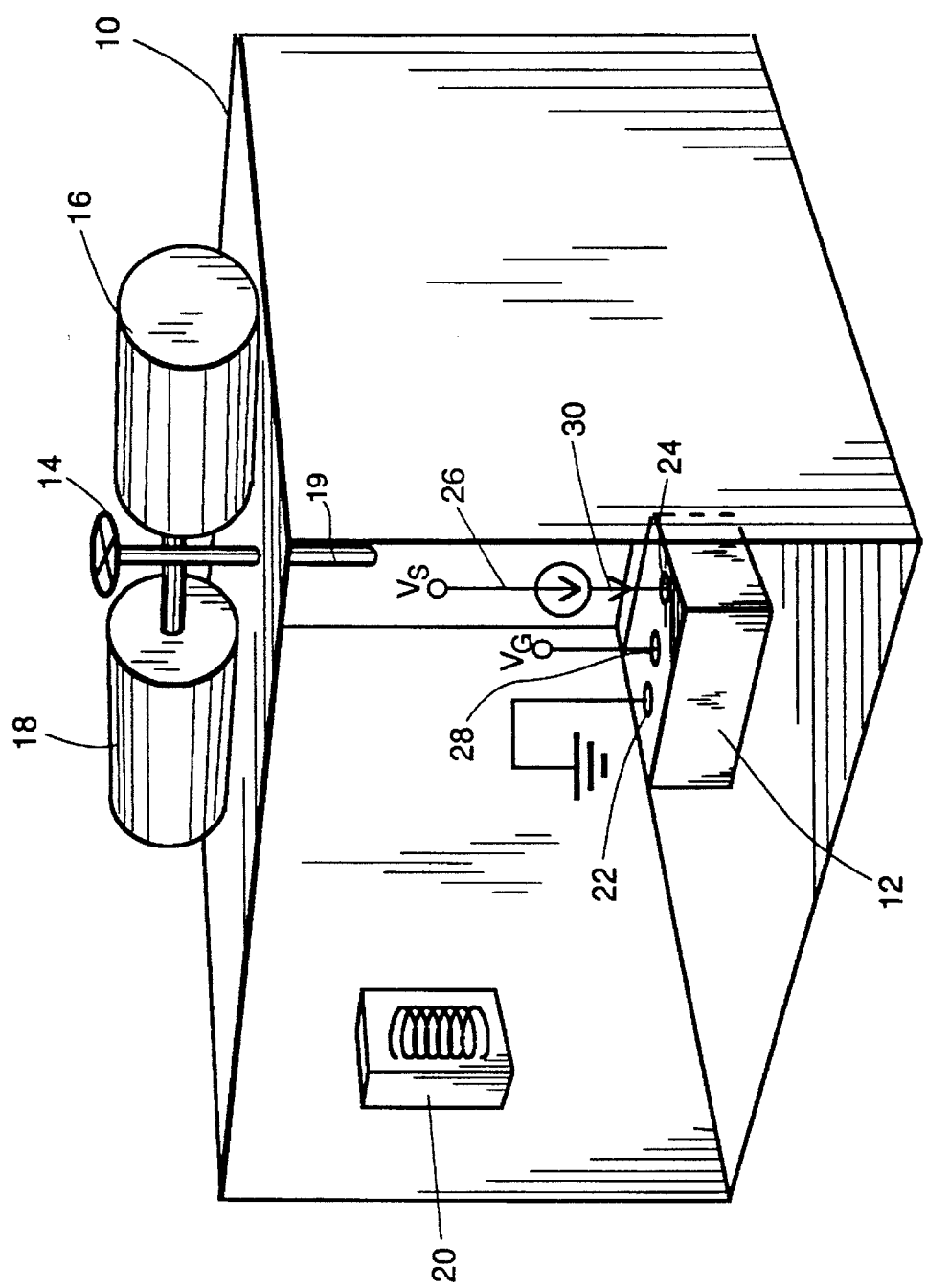
FIG. 1 is a simplified perspective view of a FET in an atmospheric heating chamber for pretreating the FET in accordance with the present invention.

FIG. 1 is a diagram of a chamber 10 for heating a hydrogen-sensitive FET 12 in a hydrogen atmosphere. As expected, the FET's performance degrades as a result of its exposure to hydrogen. Surprisingly it has been found that continuing to expose the FET to hydrogen permanently restores its performance, i.e., the FET is thereafter impervious to hydrogen. Thus the FET can be hermetically packaged without the hydrogen atmosphere within the package causing the FET's performance to degrade. The FET will eventually fail, but not as a result of a reaction with the hydrogen.

The chamber's atmosphere is regulated by a valve 14 which mixes hydrogen gas with another gas such as nitrogen from tanks 16 and 18 respectively. Standard mixtures such as 1% hydrogen in nitrogen are available in individual canisters and may be used for convenience. The gas mixture is pumped into the chamber through pipe 19, with the chamber's temperature controlled by a heating element 20. The levels of hydrogen and temperatures inside the chamber are typically higher than those in the hermetic package to accelerate the degradation and restoration of the device.

To monitor the degradation and restoration of the FET, its source electrode 22 is connected to a low voltage, commonly ground reference and its drain electrode 24 is connected through a current meter 26 to a high potential $V_S$. The FET's gate 28 is driven by a bias voltage $V_G$, producing a drain current 30 which is periodically measured by the current meter to identify the FET's degradation and subsequent recovery. The FET's electrical characteristics can also be monitored by measuring its transconductance.

Figure 2:
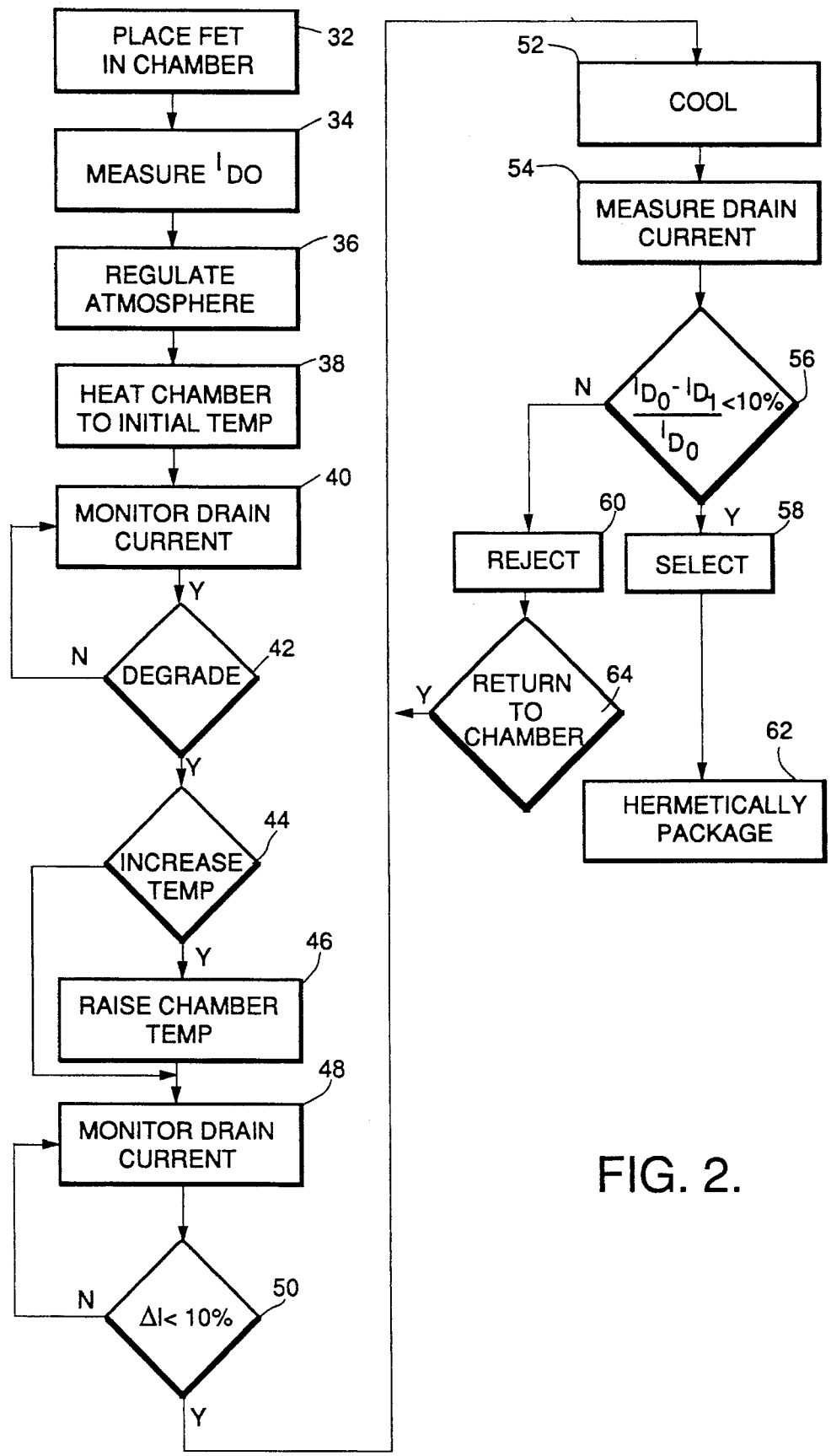
FIG. 2 is a flowchart of a process for hydrogen treatment of FETs in accordance with the present invention.

FIG. 2 is a flowchart of a preferred hydrogen treatment process 30 for hydrogen-sensitive FETs 12 such as a GaInAs HEMT. The treatment process is performed before the HEMTs are hermetically packaged and prevents the degradation normally associated with operating the devices in a hydrogen atmosphere. In step 32 the HEMT is placed in the chamber and its drain current $I_{D0}$ is measured (step 34) at the desired operating temperature (typically room temperature). In step 36 the chamber's atmosphere is set to a desired hydrogen concentration generally 0.1–4% and typically about 1% hydrogen in nitrogen. In step 38 the chamber is heated to between about 125°–200° C. for this particular device; typically about 150° C. if the temperature is increased after degradation is induced, or about 190° C. if the temperature is held constant throughout the treatment. The HEMT is monitored periodically to detect any sudden and large change in its drain current $I_D$ (steps 40 and 42). The length of time required to cause the HEMT's performance to degrade depends upon the hydrogen content of the atmosphere and the temperature.

The HEMT's performance is permanently restored by continuing to heat the device in the hydrogen atmosphere. The process has been demonstrated to work when the device is degraded at one temperature and restored at a second higher temperature. It is expected, although not yet demonstrated, that the process would work at a constant temperature, provided the temperature is high enough to achieve the desired results in a practical time period. The restoration temperature could also be lower than the degradation temperature, or the temperature could be varied throughout the process. In general, it is preferable that the temperatures and hydrogen levels be selected to shorten the recovery period and reduce the cost of the treatment process without damaging the device or causing a safety hazard. While hydrogen concentrations in excess of 4% would be expected to hasten both the device degradation and restoration, high concentrations of hydrogen gas can be volatile.

Once the device has been degraded the chamber's temperature is increased (steps 44 and 46) if the degradation temperature was relatively low, e.g., 150° C. and is held constant if the degradation temperature was relative high between 175°–225° C., typically 190° C. While temperatures in excess of 225° C. would most likely speed up the process, the HEMT's ohmic contacts degrade when exposed to temperatures greater than approximately 225° C. for an extended period of time. The HEMT's drain current $I_D$ is periodically monitored (step 48) until it stabilizes (step 50). For example, the device can be considered to have stabilized when the drain current changes by less than 2% over a 48 hour period.

In step 52 the HEMT is removed from the chamber and cooled to the desired operating temperature. In step 54 the HEMT's post-treatment drain current $I_{D1}$ is measured and compared to the pre-treatment drain current $I_{D0}$ (step 56). If $I_{D1}$ deviates from $I_{D0}$ by less than a specified tolerance, e.g., 10%, the HEMT is selected (step 58); otherwise it is rejected (step 60). The selected HEMTs are hermetically packaged (step 62) for use in applications such as low noise or power amplifiers and MMIC's. The rejected devices may be put back into the chamber (step 64) and reannealed to bring them into tolerance instead of discarding them.

Figure 3:
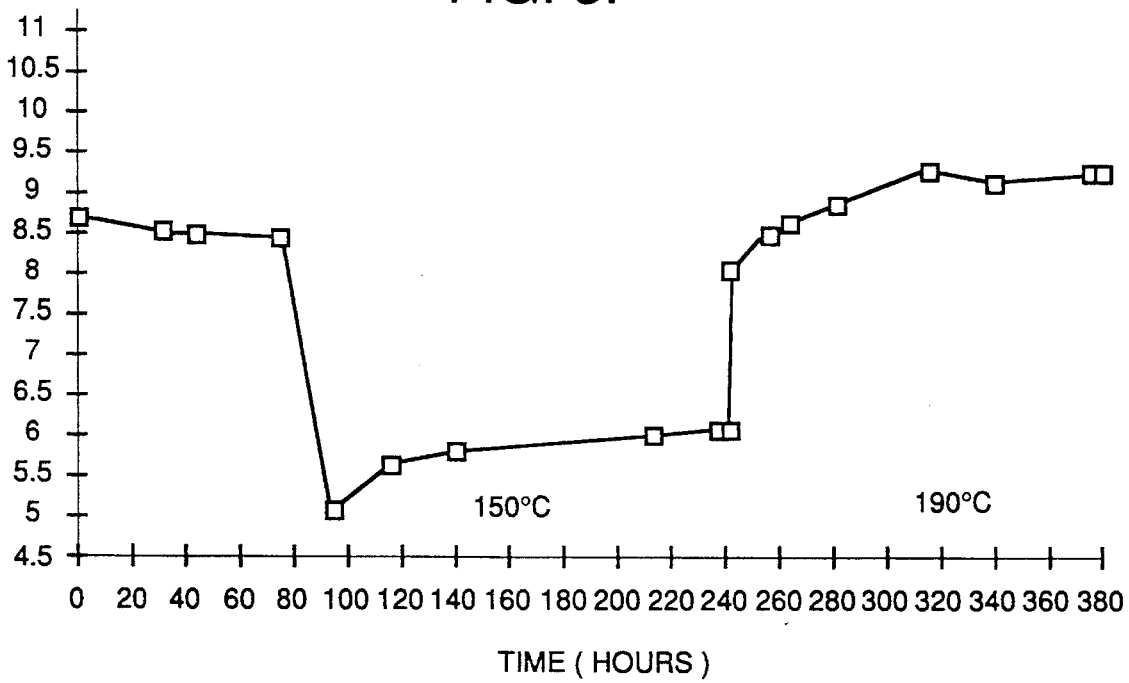
FIG. 3 is a graph of a typical GaInAs HEMT's drain current during the treatment process.

FIG. 3 is a graph of a particular GaInAs HEMT's drain current during the treatment process 30. The device was heated in an atmosphere of 1% hydrogen in nitrogen with an initial temperature of 150° C. The current was fairly stable at approximately 8.75 mA for the first 80 hours, and then dropped sharply to a minimum value of approximately 5 mA. Over the next 160 hours the drain current recovered to approximately 6 mA. At this point the rate of further recovery became very slow and complete recovery, if possible, would have taken a very long time.

To speed up the recovery process, the temperature was increased to 190° C. after the degradation cycle. The drain current jumped in response to the temperature increase and then continued to increase for approximately 140 hours before stabilizing. The current jump from 6 mA to about 8.25 mA is believed to be a direct result of the higher operating temperature. An increase from 8.25 mA to approximately 9.5 mA was noted corresponding to a recovery of the remaining portion of the drain current. The final drain current being higher than the initial drain current is believed to be a result of the difference in temperatures.

Figure 4:
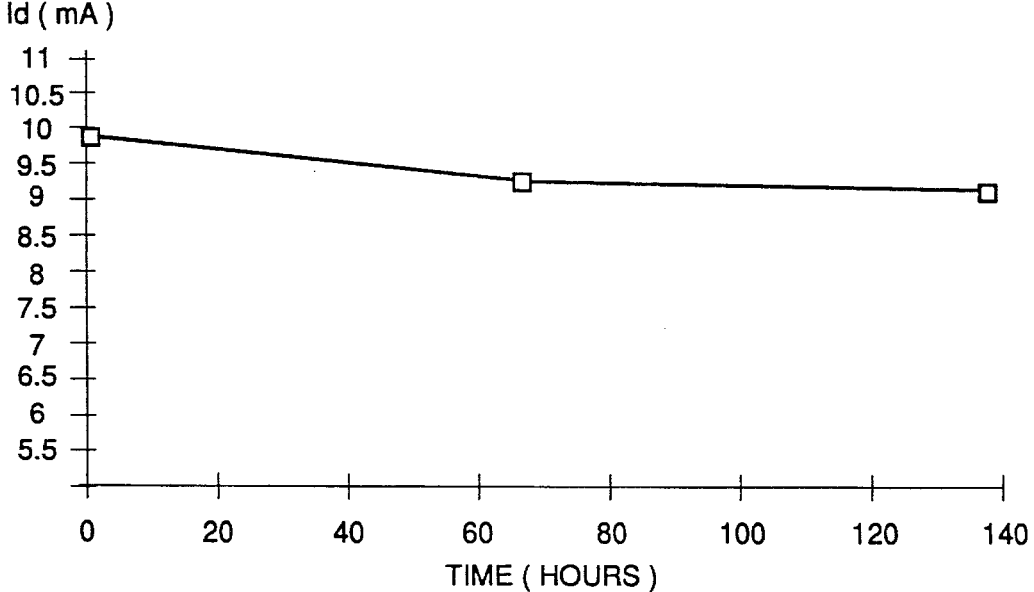
FIG. 4 is a graph of the GaInAs HEMT's drain current when re-exposed to hydrogen.

FIG. 4 is a graph of the drain current for the HEMT treated in FIG. 3, when subsequently re-exposed to an atmosphere of 1% hydrogen at 150° C. The drain current remained approximately constant over a 140 hour period. Hermetically packaged HEMTs that are pretreated with the described process are believe to have lifetimes of approximately 15 years, much longer than the 3 year lifetime for untreated devices.

Figure 5:
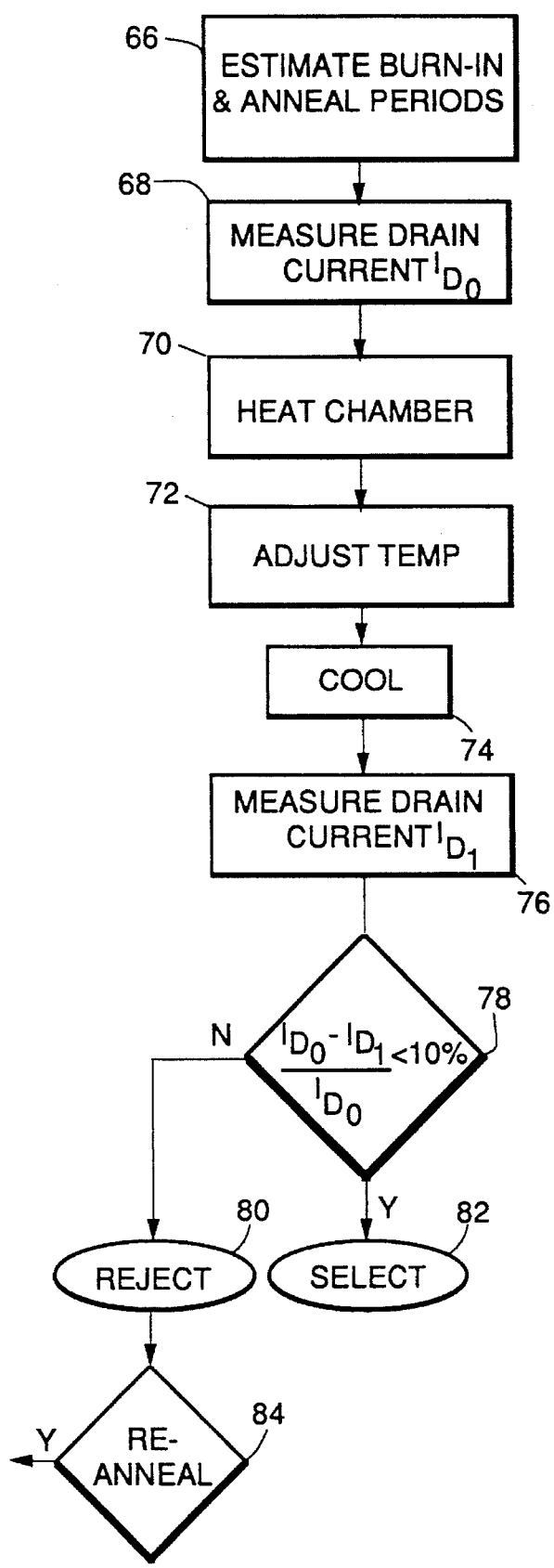
FIG. 5 is a flowchart of an alternative embodiment of the invention.

FIG. 5 illustrates an alternative method for pretreating the HEMTs without biasing the devices or monitoring their drain currents. In the alternative embodiment the devices are heated for estimated periods of time to degrade and restore the HEMT. One way of estimating the prooper time periods is to apply the preferred embodiment to a number of test devices and compute the average degradation and restoration periods.

In step 66 the degradation and restoration periods are estimated. In step 68 the HEMT is placed inside the chamber and its drain current is measured at the desired operating temperature. In step 70 the chamber's temperature is increased to the prescribed temperature and the device is heated for the estimated degradation period. The temperature is then increased to, or held constant at, the restoration temperature (step 72), which is maintained for the estimated restoration period.

When the treatment is finished the HEMT is removed from the chamber and cooled (step 74) to the desired operating temperature. In step 76 the HEMT's drain current is measured and compared to the pre-treatment current (step 78). The device is rejected (step 80) if the difference is too large; otherwise the device is selected (step 82) and hermetically packaged. Rejected devices may be reannealed in the chamber (step 84) to bring them within tolerance.

The alternative treatment provides less control over the process, but does not require biasing the device and monitoring its drain current over the entire treatment period. If the degradation and restoration times are fairly consistent, the alternative may be an easier and more cost effective approach.

The described process has been demonstrated to completely and permanently restore the performance of GaInAs HEMTs whose drain currents decrease during the degradation portion of the treatment process. These devices are unaffected by re-exposure to hydrogen, either in a simulated atmosphere or in a hermetic package. However, if the HEMTs' drain currents increase during degradation, the process temporarily restores their performance but has not been found to prevent them from degrading again when reexposed to hydrogen. Similarly, the process has not been found to work for GaAs P-HEMTs or GaAs MESFETs, although it is believed that it may work for other FETs.

The described hydrogen treatment process makes possible the use of the GaInAs HEMTs, and possibly other FETs, in applications such as space communications for which they were previously not practical. These devices provide a longer lifetime, approximately 15 years as compared to 10 years for the devices currently used, and are capable of efficiently handling high power levels. The treatment process improves the FETs' performance and reduces the cost of commercial applications that use them. The treated FETs are beleived to have lifetimes approximately five times that of the untreated FETs, which reduces the inconvenience and expense of having to replace them.

While several illustrative embodiments of the invention have been shown and described, numerous variations and alternate embodiment will occur to those skilled in the art. Such variations and alternate embodiments are contemplated, and can be made without departing from the spirit and scope of the invention as defined in the appended claims.

We claim:

1. A method for pretreating a Field Effect Transistor (FET), comprising:
   heating said FET in the presence of hydrogen to degrade its performance; and
   continuing to heat said FET in the presence of hydrogen for a period of time sufficient to permanently restore its performance so that the FET is substantially unaffected by a subsequent re-exposure to hydrogen.

2. The method of claim 1, further comprising monitoring said FET's performance to determine when it has stabilized.

3. The method of claim 2, wherein said FET's performance is monitored by measuring its drain current.

4. The method of claim 1, wherein said FET is heated at a first temperature to degrade and partially restore its performance and at a second higher temperature to complete restoration of the FET.

5. The method of claim 1, further comprising:
   measuring the FET's drain current at a desired operating temperature before heating it;
   measuring the FET's drain current at said desired operating temperature after heating it; and
   selecting or rejecting the FET based upon the difference between its drain current before and after heating.

6. The method of claim 5, further comprising:
   hermetically packaging the selected FET.

7. The method of claim 1, wherein said FET is heated at a temperature between 125° C. and 225° C. until its drain current stabilizes.

8. The method of claim 1, wherein said FET is a GaInAs High Electron Mobility Transistor (HEMT).

9. The method of claim 8, wherein the step of heating said GaInAs HEMT causes its drain current to first be reduced and then increased to restore its performance.

10. A method for pretreating a gallium-indium-arsenide (GaInAs) High Electron Mobility Transistor (HEMT), comprising:
    heating said HEMT in the presence of hydrogen to reduce its drain current; and
    continuing to heat said HEMT in the presence of hydrogen to increase its drain current and permanently restore its performance so that the HEMT is substantially unaffected by a subsequent re-exposure to hydrogen.

11. The method of claim 10, wherein said HEMT is heated at a first temperature to degrade and partially restore its performance and at a second higher temperature to complete restoration of the HEMT.

12. The method of claim 10, wherein said HEMT is heated at a temperature between 125° C. and 225° C. until its drain current stabilizes.

13. A method for pretreating a Field Effect Transistor (FET), comprising:
    determining a period of time for heating said FET at a desired hydrogen concentration that is sufficiently long to render said FET substantially impervious to hydrogen; and
    heating said FET in a hydrogen atmosphere at approximately said desired hydrogen concentration for said period of time to prevent said FET from degrading when it is re-exposed to hydrogen.

14. The method of claim 13, wherein said time period comprises degradation and restoration periods which are determined by:
    heating a test FET until its drain current degrades; and
    heating said test FET until its drain current stabilizes.

15. The method of claim 13, wherein said FET is a GaInAs High Electron Mobility Transistor (HEMT).

16. The method of claim 13, wherein said FET is heated at a temperature between 125° C. and 225° C. until its drain current stabilizes.

17. A method for treating a Field Effect Transistor (FET), said FET having an initial drain current at a desired operating temperature, comprising:
    heating said FET in the presence of hydrogen to first degrade and then restore its drain current to within 10% of its initial value so that the FET becomes substantially impervious to subsequent re-exposure to hydrogen; and
    hermetically packaging said FET.

18. The method of claim 17, further comprising measuring said FET's drain current to determine when it has stabilized.

19. The method of claim 18, wherein said FET is a GaInAs High Electron Mobility Transistor (HEMT).

* * * * *